(12) United States Patent
Vaid et al.

(10) Patent No.: US 9,177,873 B2
(45) Date of Patent: Nov. 3, 2015

(54) SYSTEMS AND METHODS FOR FABRICATING SEMICONDUCTOR DEVICE STRUCTURES

(71) Applicant: GLOBALFOUNDRIES, Inc., Grand Cayman (KY)

(72) Inventors: Alok Vaid, Ballston Lake, NY (US); Carsten Hartig, Meerane (DE); Lokesh Subramany, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/953,532

(22) Filed: Jul. 29, 2013

(65) Prior Publication Data
US 2015/0033201 A1  Jan. 29, 2015

(51) Int. Cl.
*G06F 17/00* (2006.01)
*H01L 21/66* (2006.01)
*G03F 7/20* (2006.01)

(52) U.S. Cl.
CPC ............ *H01L 22/00* (2013.01); *G03F 7/70616* (2013.01)

(58) Field of Classification Search
CPC .................................. G06F 17/30; G06F 17/50
USPC ........ 716/135, 55, 53, 118; 702/155; 257/774
See application file for complete search history.

(56) References Cited

U.S. PATENT DOCUMENTS

| | | | |
|---|---|---|---|
| 2008/0183312 A1* | 7/2008 | Funk et al. | 700/45 |
| 2008/0183412 A1* | 7/2008 | Funk et al. | 702/97 |
| 2011/0216293 A1* | 9/2011 | Padiy et al. | 355/52 |
| 2013/0203188 A1* | 8/2013 | Vaid et al. | 438/14 |
| 2014/0273299 A1* | 9/2014 | Vaid et al. | 438/14 |

OTHER PUBLICATIONS

Silver, R. et al., "Improving optical measurement accuracy using multi-technique nested uncertainties" in Metrology, Inspection, and Process Control for Microlithography XXIII, edited by John A. Allgair, Christopher J. Raymond, Proceedings of SPIE vol. 7272 (SPIE, Bellingham, WA 2009) 727202.

Rana, N. et al., "Hybrid reference metrology exploiting patterning simulation" in Metrology, Inspection, and Process Control for Microlithography XXIV, edited by Christopher J. Raymond, Proceedings of SPIE vol. 7638 (SPIE, Bellingham, WA 2010) 76380W.

Foucher, J. et al., "3D-AFM enhancement for CD metrology dedicated to lithography sub-28-nm node requirements" in Metrology, Inspection, and Process Control for Microlithography XXIV, edited by Christopher J. Raymond, Proceedings of SPIE vol. 7638 (SPIE, Bellingham, WA 2010) 763802.

(Continued)

*Primary Examiner* — Mohammed Alam
(74) *Attorney, Agent, or Firm* — Ingrassia Fisher & Lorenz, P.C.

(57) ABSTRACT

Methods and systems are provided for fabricating and measuring physical features of a semiconductor device structure. An exemplary method of fabricating a semiconductor device structure involves obtaining raw measurement data for a wafer of semiconductor material from a metrology tool and adjusting a measurement model utilized by a metrology tool based at least in part on the raw measurement data and a value for a design parameter. The wafer has that value for the design parameter and an attribute of the semiconductor device structure fabricated thereon, wherein the measurement model is utilized by the metrology tool to convert the raw measurement data to a measurement value for the attribute.

18 Claims, 4 Drawing Sheets

(56) References Cited

OTHER PUBLICATIONS

Vaid A. et al., "Simultaneous measurement of optical properties and geometry of resist using multiple scatterometry targets" in Journal of Micro/Nanolithography, MEMS, and MOEMS 9(04) 041306 (Dec. 9, 2010).

Vaid et al., "A Holistic Metrology Approach: Hybrid Metrology Utilizing Scatterometry," Proceedings of SPIE vol. 7971 (Mar. 28, 2011) 797103.

Vaid et al., "Hybrid Metrology for Advanced Semiconductor Fabrication," SPIE Newsroom, (Aug. 17, 2011).

U.S. Appl. No. 13/419,286, filed Mar. 13, 2012 entitled Automated Hybrid Metrology for Semiconductor Device Fabrication.

U.S. Appl. No. 13/365,920, filed Feb. 3, 2012 entitled Hybrid Metrology for Semiconductor Devices.

U.S. Appl. No. 13/841,919, filed Mar. 15, 2013 entitled Systems and Methods for Fabricating Semiconductor Device Structures Using Different Metrology Tools.

* cited by examiner

SYSTEMS AND METHODS FOR FABRICATING SEMICONDUCTOR DEVICE STRUCTURES

TECHNICAL FIELD

Embodiments of the subject matter described herein generally relate to fabricating semiconductor device structures and more particularly, to systems and methods for fabricating semiconductor devices wherein the systems and methods dynamically determine a measurement model for obtaining a measurement value for a physical feature, dimension, or other attribute of a semiconductor device structure based at least in part on raw measurement data and design parameters for one or more wafers of semiconductor material having the semiconductor device structure fabricated thereon.

BACKGROUND

Semiconductor devices, such as transistors, are the core building block of the vast majority of electronic devices. In practice, it is desirable to accurately and precisely fabricate transistors and other semiconductor devices with physical features having specific physical dimensions to thereby achieve semiconductor devices having their intended performance characteristics and to improve yield. However, the hardware tools used to fabricate the devices may exhibit performance variations. As a result, devices may be fabricated with features that deviate from their specified physical dimensions, which, in turn, could lead to failures at wafer test and, accordingly, reduce yield. Thus, it is desirable to measure physical features, critical dimensions and/or other properties of devices during fabrication to correct any deviations from the intended physical dimensions and thereby reduce the likelihood of failures at wafer test and improve yield.

Obtaining highly accurate measurements using non-destructive metrologies (which reduce yield) typically take an undesirably long amount of time or undesirably increases costs. For example, to use scatterometry to measure a particular device feature of a semiconductor device structure, a specific model must be developed to convert raw measurement spectra to a corresponding measurement for that feature. The model is often developed after the process for fabricating that semiconductor device structure has been substantially established or fixed, and therefore, the time required to develop and accurate model and the time required to develop the fabrication process are compounded, thereby increasing the overall time-to-solution. Additionally, the resulting model often assumes that one or more design parameters for the semiconductor device structure are fixed (by virtue of the design process being pre-established), and therefore, is inflexible and unable to accommodate subsequent changes to those design parameters.

BRIEF SUMMARY

In one embodiment, a method is provided for fabricating a semiconductor device structure. The method involves obtaining raw measurement data for a wafer of semiconductor material from a metrology tool and adjusting a measurement model utilized by the metrology tool to convert the raw measurement data to a measurement value for an attribute fabricated on the wafer based at least in part on the raw measurement data and a first value for a design parameter for the wafer.

In another embodiment, a method of fabricating a semiconductor device structure involves fabricating a feature of the semiconductor device structure on a first wafer of semiconductor material having a first value for a design parameter, obtaining first raw measurement data for the first wafer from a metrology tool, the metrology tool utilizing an existing measurement model to convert the raw measurement data to a measurement value for the feature, determining an adjusted measurement model based at least in part on the first raw measurement data, the first value, second raw measurement data obtained from the metrology tool for a second wafer, and a second value, the second wafer having the second value for the design parameter, and configuring the metrology tool to utilize the adjusted measurement model when a quality metric indicates the adjusted measurement model is better than the existing measurement model.

In yet another embodiment, an apparatus for a computer-readable medium is provided. The computer-readable medium has computer-executable instructions stored thereon that are executable by a computing device to obtain raw measurement data for a wafer of semiconductor material from a metrology tool, the wafer having a first value for a design parameter and an attribute of a semiconductor device structure fabricated thereon, the metrology tool utilizing a measurement model to convert the raw measurement data to a measurement value for the attribute, and adjust the measurement model based at least in part on the raw measurement data and the first value for the design parameter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
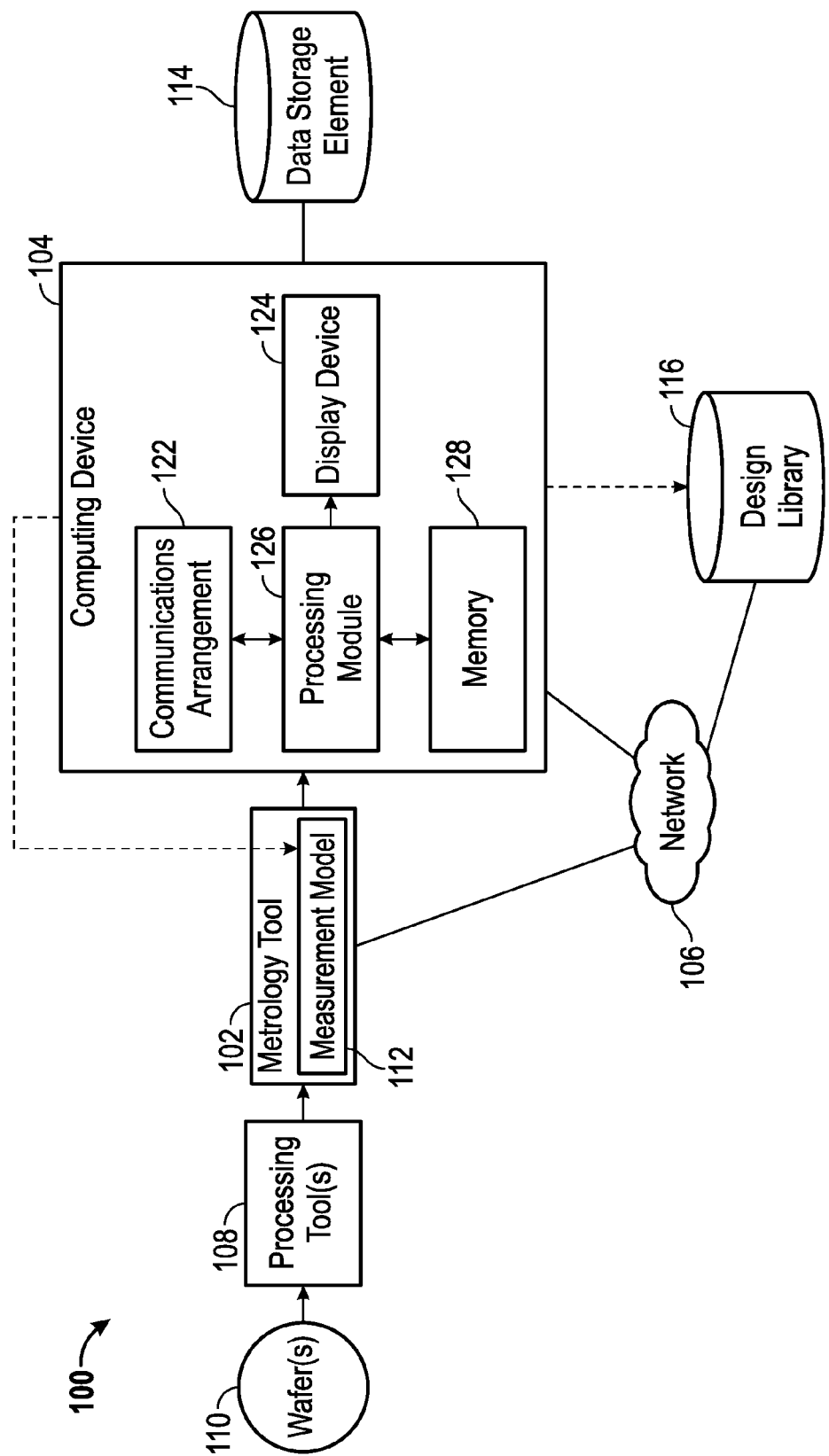
FIG. 1 is a block diagram of an exemplary measurement system.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description. For the sake of brevity, conventional techniques related to semiconductor fabrication, semiconductor metrology tools and/or methods, measurement model generation, goodness of fit analysis, and other functional aspects of the systems (and the individual operating components of the systems) are not described in detail herein.

Embodiments of the subject matter described herein relate to methods and systems for fabricating semiconductor device structures that involve dynamically adjusting the measurement model used to convert raw measurement data obtained from a wafer by a metrology tool determine a measurement value for a particular attribute of a semiconductor device structure fabricated on the wafer. The measurement model includes a formula or function for calculating the measurement value as a function of the raw measurement data obtained by the metrology tool from a respective wafer and values or criteria for one or more design parameters that quantify or otherwise describe the fabrication processes that the wafer was exposed or otherwise subjected to during fabrication of the semiconductor device structure on the wafer. In this regard, the measurement model estimates the relationship or correlation between the obtained raw measurement data, the design parameter values, and the actually fabricated dimensions of the attribute being measured. Depending on the embodiment, an attribute being measured may be a physical feature, structure or dimension, an absence of a physical feature or structure (e.g., a recess, void or the like), or an intrinsic property (e.g., ion concentration, index of refraction, bulk modulus, electron mobility, or other compositional and/or optical properties). That said, for clarity and ease of explanation, the subject matter may be described herein in the context of measuring physical features and/or dimensions of semiconductor device structures. However, it should be understood that the subject matter is not limited to physical features and/or dimensions and may be utilized to obtain measurement models for intrinsic properties or other attributes of a semiconductor device structure and/or wafer.

After an initial measurement model that estimates the relationship or correlation between the obtained raw measurement data, the design parameter values, and the actual fabricated dimensions of the attribute being measured (alternatively referred to herein as the feature of interest), the measurement model is dynamically adjusted using raw measurement data obtained by the metrology tool from additional wafers to improve one or more quality metrics indicating the goodness of fit for the measurement model. For example, an additional wafer may be provided to one or more processing tools for processing in accordance with a set of design parameter values to fabricate, on the wafer, a semiconductor device structure including the feature of interest. Thereafter, that wafer is provided to the metrology tool being modeled, which, in turn, obtains raw measurement data from the wafer. Using the raw measurement data and the design parameter values for the current wafer, an adjusted measurement model may be determined that takes into account the raw measurement data and the design parameter values for the current wafer. For example, the range of allowable values for a particular design parameter in the measurement model may be modified or otherwise adjusted to encompass the value for that design parameter that is associated with the current wafer, and thereafter, a new measurement model formula or function may be determined that estimates the relationship or correlation between the obtained raw measurement data and the design parameter value for the current wafer to the actual fabricated dimensions of the feature of interest on the current wafer. When the quality metric(s) associated with the new measurement model formula indicate the goodness of fit is improved relative to the pre-existing measurement model formula, the metrology tool is updated to implement the new measurement model formula to convert subsequently obtained raw measurement data to corresponding measurement values for the feature of interest. Thereafter, one or more additional wafers including the feature of interest fabricated thereon in accordance with particular design parameter values may be provided to the metrology tool to obtain raw measurement data from the wafer, wherein the raw measurement data and design parameter values for the respective additional wafer may be utilized to further adjust and improve the measurement model (e.g., by further adjusting the range of allowable values for a particular design parameter in the measurement model, adding or removing a particular design parameter to/from the measurement model formula, or the like). Thus, the measurement model may be iteratively and/or dynamically adjusted to achieve improved goodness of fit.

Referring now to FIG. 1, in an exemplary embodiment, a measurement system 100 includes a metrology tool 102 communicatively coupled to a computing device 104 over a communications network 106, such as a computer network (e.g., a wide area network, a wireless local area network, or the like), a cellular network, an ad-hoc or peer-to-peer network, or the like. As described in greater detail below in the context of FIG. 2, the metrology tool 102 includes hardware capable of measuring physical features, dimensions and/or other attributes of one or more semiconductor device structures fabricated on a substrate (or wafer) 110 of semiconductor material by one or more preceding processing tools 108. It should be understood that FIG. 1 is a simplified representation of the measurement system 100 for purposes of explanation and ease of description, and FIG. 1 is not intended to limit the subject matter in any way.

After fabrication of one or more physical features or attributes of the semiconductor device(s) on the wafer 110 by the preceding processing tool(s) 108, the metrology tool 102 is utilized to measure or otherwise quantify the fabricated dimensions of one or more physical features or attributes on the wafer 110 using a measurement technique, such as, for example, scatterometry, scanning electron microscopy, atomic force microscopy, interferometry, reflectometry, ellipsometry, and the like. To determine measurements for a particular attribute of a semiconductor device structure, the metrology tool 102 utilizes a measurement model associated with that particular attribute to convert raw measurement data associated with the wafer 110 to a corresponding measurement value representing an estimate of the actual physical dimension of that attribute. In this regard, the measurement model includes a formula that defines the measurement value for a particular physical feature, dimension or other attribute on a wafer 110 as a function of the raw measurement data obtained for that wafer 110 and the values of one or more design parameters for the wafer 110.

In exemplary embodiments, the metrology tool 102 communicates with the computing device 104 to transfer or otherwise provide the calculated measurement value(s) for attribute(s) on the wafer 110 along with the corresponding raw measurement data that the measurement value is based on. The computing device 104 is coupled to a data storage element 114 that stores or otherwise maintains calculated measurement value(s) and the raw measurement data for a particular wafer 110 in association with the design parameters for that wafer 110. For example, the data storage element 114 may include a table that includes a first column corresponding to a unique identifier for a particular wafer, one or more columns corresponding to the design parameters for that wafer, one or more columns corresponding to the raw measurement data, and one or more columns corresponding to the calculated measurement value(s) for the attribute(s) on that wafer. In this regard, each row of the table may correspond to an individual wafer. In practice, the data storage element 114 may be realized as any suitable short or long term storage media, including any sort of random access memory (RAM), read only memory (ROM), flash memory, registers, hard disks, removable disks, magnetic or optical mass storage, databases, and/or the like or a combination thereof.

As described in greater detail below in the context of FIG. 3-4, using the raw measurement data and the design parameters for the most recently measured wafer 110 along with the stored raw measurement data and stored design parameters for one or more previously measured wafers, the computing device 104 calculates or otherwise determines one or more quality metrics for the measurement model 112 currently being utilized by the metrology tool 102. The quality metric can be any value or metric that characterizes or otherwise quantifies the agreement or correlation between the stored raw measurement data and the measurement values determined using the measurement model 112. For example, the quality metric may be realized as a chi-square value or another correlation metric indicating the relative goodness of fit of the measurement model 112. When the calculated value(s) for the quality metric(s) indicate the measurement model 112 could or should be improved, the computing device 104 determines an adjusted measurement model formula using the raw measurement data and the design parameter values for the most recently measured wafer 110 along with stored raw measurement data and stored design parameter values for previously measured wafers. Thereafter, the computing device 104 calculates or otherwise determines one or more quality metrics for the adjusted measurement model, and when the quality metric(s) for the adjusted measurement model indicate that it is better than the measurement model 112 currently being utilized by the metrology tool 102, the computing device 104 updates or otherwise configures the metrology tool 102 to utilize or otherwise implement the adjusted measurement model formula as the measurement model 112 in lieu of the previous measurement model formula. In this manner, the computing device 104 dynamically and/or iteratively adjusts the measurement model 112 utilized by the metrology tool 102 based at least in part on the raw measurement data and the design parameters for the most recently measured wafer 110. Additionally, when development cycle for the measurement model 112 has been completed or when the adjusted measurement model is sufficiently stable (e.g., differences relative to the previous measurement model are substantially small) and/or the quality metric(s) indicate the adjusted measurement model has achieved a desired level of accuracy and/or reliability (e.g., by exceeding threshold value(s) for those quality metric(s)), the computing device 104 uploads or otherwise stores the final adjusted measurement model formula in a design library 116 as a validated measurement model associated with that particular feature or attribute for the type of metrology technique (e.g., scatterometry) associated with the metrology tool 102. In this regard, the design library 116 represents a data storage element coupled to the network 106 that may be accessed by additional metrology tools and/or computing devices to obtain measurement models associated with that particular features or attributes of interest being measured by a particular type of metrology tool.

Still referring to FIG. 1, in an exemplary embodiment, the computing device 104 includes, without limitation, a communications arrangement 122, a display device 124, a processing module 126, and a data storage element (or memory) 128. The communications arrangement 122 generally represents the hardware, software, firmware and/or a combination thereof which is coupled to the processing module 126 and cooperatively configured to support communications between the computing device 104 and the metrology tool 102 via the network 106. The display device 124 is realized as an electronic display (e.g., a liquid crystal display (LCD), a light emitting diode (LED) display, or the like) configured to graphically display information and/or content under control of the processing module 126. The processing module 126 generally represents the hardware, firmware, processing logic, and/or other components of the computing device 104 configured to support operation of the computing device 104 and execute various functions and/or processing tasks as described in greater detail below. Depending on the embodiment, the processing module 126 may be implemented or realized with a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, a method or algorithm described in connection with the embodiments disclosed herein may be embodied directly in hardware, in firmware, in a software module executed by the processing module 126, or in any practical combination thereof. The memory 128 generally represents any non-transitory short or long term storage media capable of storing programming instructions for execution by the processing module 126, including any sort of random access memory (RAM), read only memory (ROM), flash memory, registers, hard disks, removable disks, magnetic or optical mass storage, and/or the like. The programming instructions, when read and executed by the processing module 126, cause the processing module 126 to perform certain tasks, operations, functions, and processes described in more detail below.

Figure 2:
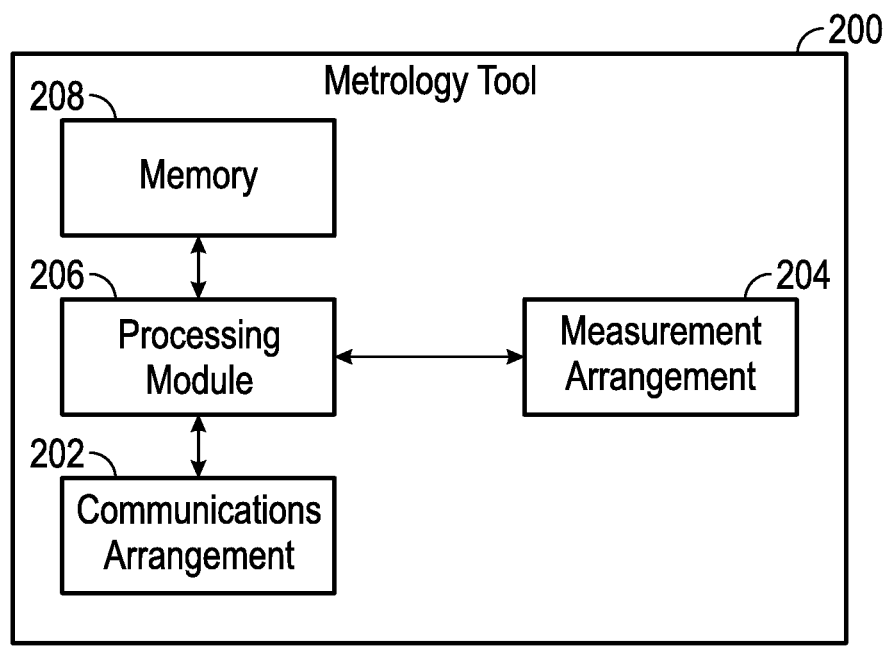
FIG. 2 is a block diagram of an exemplary metrology tool suitable for use in the measurement system of FIG. 1 in accordance with one or more embodiments.

FIG. 2 depicts an exemplary embodiment of a metrology tool 200 suitable for use as a metrology tool 102 in the measurement system 100 of FIG. 1. The illustrated metrology tool 200 includes, without limitation, a communications arrangement 202, a measurement arrangement 204, a processing module 206, and a data storage element (or memory) 208. It should be understood that FIG. 2 is a simplified representation of the metrology tool 200 for purposes of explanation and ease of description, and FIG. 2 is not intended to limit the subject matter in any way.

In the illustrated embodiment, the communications arrangement 202 generally represents the hardware, software, firmware and/or combination thereof which are coupled to the processing module 206 and cooperatively configured to support communications to/from the metrology tool 200 via a network (e.g., network 106) in a conventional manner. The measurement arrangement 204 generally represents the combination of radiation sources, illumination devices, electron guns, sensors, detectors, optics, and/or other hardware components of the metrology tool 200 which are utilized to measure physical features, dimensions and/or other attributes of semiconductor devices on a wafer. In accordance with one or more embodiments, the measurement arrangement 204 is capable of transmitting, emitting, or otherwise directing a reference signal towards a wafer and sensing, receiving, or otherwise measuring a response signal from the wafer. In this regard, the physical features, dimensions and/or other attributes of the wafer modulate or otherwise influence characteristics of the reference signal resulting in the response signal that is sensed or otherwise received by the measurement arrangement 204. Thus, the response signal corresponds to raw feature measurement data that is indicative of the dimensions of the various physical features, dimensions and/or other attributes on the wafer 110, which can be determined based on characteristics of the response signal (e.g., the spectral characteristics, waveforms, or the like) or the relationship between the response signal and the reference signal.

The processing module 206 generally represents the hardware, firmware, processing logic, and/or other components of the metrology tool 200 configured to control or otherwise operate the measurement arrangement 204 to measure physical features and/or dimensions on a wafer, communicate feature measurements to/from the metrology tool 200, store feature measurements in the memory 208, and execute various functions and/or processing tasks as described in greater detail below. Depending on the embodiment, the processing module 206 may be implemented or realized with a general purpose processor, a microprocessor, a controller, a microcontroller, a state machine, a content addressable memory, an application specific integrated circuit, a field programmable gate array, any suitable programmable logic device, discrete gate or transistor logic, discrete hardware components, or any combination thereof, designed to perform the functions described herein. Furthermore, the steps of a method or algorithm described in connection with the embodiments disclosed herein may be embodied directly in hardware, in firmware, in a software module executed by the processing module 206, or in any practical combination thereof. The memory 208 represents any non-transitory short or long term storage media capable of storing programming instructions for execution by the processing module 206, which, when read and executed by the processing module 206, cause the processing module 206 to perform certain tasks, operations, functions, and processes described in more detail herein. In accordance with one or more embodiments, the memory 208 also stores one or more measurement models associated with a respective feature or attribute for converting the raw measurement data embodied by the response signal received by the measurement arrangement 204 into corresponding measurement values for those particular features or attributes, as described in greater detail below.

Figure 3:
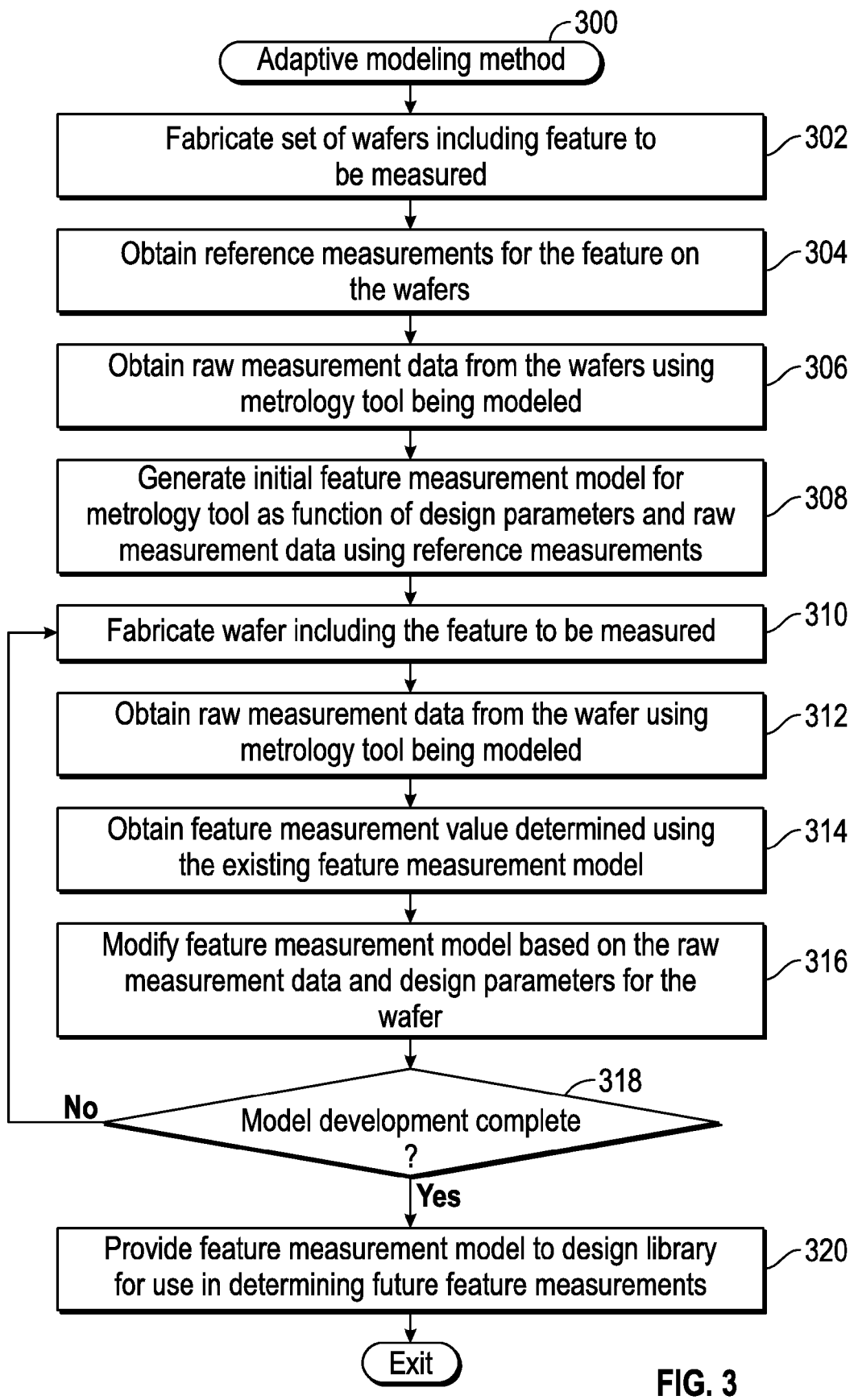
FIG. 3 is a flow diagram of an exemplary adaptive modeling method suitable for use with the measurement system of FIG. 1 in an exemplary embodiment.

FIG. 3 depicts an exemplary adaptive modeling method 300 suitable for implementation by a measurement system 100 to dynamically and/or iteratively adjust a measurement model for a particular physical feature or attribute of a semiconductor device structure and provide the developed measurement model to a design library. The various tasks performed in connection with the adaptive modeling method 300 may be performed by software, hardware, firmware, or any combination thereof. For illustrative purposes, the following description refers to elements mentioned above in connection with FIGS. 1-2. In practice, portions of the adaptive modeling method 300 may be performed by different elements of the measurement system 100, such as, for example, the metrology tool 102, 200, the computing device 104, the processing tool(s) 108, the data storage element 114, the design library 116, the processing module 126, the measurement arrangement 204 and/or the processing module 206. It should be appreciated that the adaptive modeling method 300 may include any number of additional or alternative tasks, the tasks need not be performed in the illustrated order and/or the tasks may be performed concurrently, and/or the adaptive modeling method 300 may be incorporated into a more comprehensive procedure or process having additional functionality not described in detail herein. Moreover, one or more of the tasks shown and described in the context of FIG. 3 could be omitted from a practical embodiment of the adaptive modeling method 300 as long as the intended overall functionality remains intact.

Referring to FIG. 3, and with continued reference to FIGS. 1-2, in the illustrated embodiment, the adaptive modeling method 300 begins by fabricating an initial set of wafers having the particular feature of interest fabricated thereon and obtaining reference measurements of the feature of interest from the wafers of the initial set (tasks 302, 304). In exemplary embodiments, the initial set of wafers are realized as one or more design of experiment (DoE) wafers that exhibit process excursions or other variations in the design parameters for the wafer and/or the feature of interest. In this regard, each DoE wafer is processed by the processing tool(s) 108 to fabricate the feature of interest in accordance with a different set of design parameters relative to the other DoE wafers. Thus, the resulting shape, size and/or other characteristics of the feature of interest on a respective DoE wafer may be different from the feature of interest on the other DoE wafers so that the raw measurement data obtained from a respective DoE wafer may be different from the raw measurement data obtained from the other DoE wafers. In exemplary embodiments, the computing device 104 may store or otherwise maintain (e.g., in the data storage element 114) a unique identifier associated with a respective DoE wafer (e.g., the wafer ID) in association with the design parameters utilized to configure the processing tool(s) 108 for processing that respective wafer. In some embodiments, the design parameters may be provided to the computing device 104 by a user (e.g., a process engineer or the like) responsible for configuring the processing tool(s) 108 for the respective DoE wafers. The reference measurements for the feature of interest on the DoE wafers are obtained using a validated metrology tool such that the reference measurements substantially reflect the actual dimension of the feature of interest. For example, the reference measurements may be obtained using a critical dimension scanning electron microscope (CD-SEM), transmission electron microscope (TEM), or a destructive metrology technique. In this regard, it will be appreciated that if a destructive metrology technique is utilized to obtain the reference measurements, raw measurement data is obtained from the respective DoE wafers (e.g., task 306) prior to performing the destructive measurements. In exemplary embodiments, the computing device 104 also stores or otherwise maintains (e.g., in the data storage element 114) the reference measurement of the feature of interest on a respective DoE wafer in association with the unique identifier for that respective DoE wafer and the design parameters utilized to configure the processing tool(s) 108 for processing that respective wafer.

In exemplary embodiments, the adaptive modeling method 300 continues by obtaining raw measurement data from the wafers of the initial set using the metrology tool being modeled (task 306). To obtain the raw measurement data, each respective DoE wafer is provided to the metrology tool 102, which, in turn, transmits, emits, or otherwise directs a reference signal towards the wafer and senses, receives, or otherwise measures a response signal that is modulated, deflected, or otherwise transmitted back from the wafer, as described above in the context of FIG. 2. The metrology tool 102 communicates, transmits, or otherwise provides the raw measurement data embodied in the response signal (e.g., the spectral characteristics, waveforms, or the like) to the computing device 104, which, in turn, stores or otherwise maintains the raw measurement data obtained from a respective DoE wafer in association with the unique identifier for that respective DoE wafer, the design parameters utilized to configure the processing tool(s) 108 for processing that respective wafer, and the reference measurements obtained from that respective wafer. For example, when the metrology tool 102 is a scatterometry tool, the computing device 104 may store or otherwise maintain the response spectrum obtained from a respective DoE wafer in association that wafer in the data storage element 114.

After obtaining the raw measurement data and the reference measurements for a feature of interest from an initial set of wafers, the adaptive modeling method 300 continues by generating or otherwise determining an initial measurement model for converting raw measurement data obtained by the metrology tool being modeled to a corresponding measurement value for the feature of interest based on the relationship between the reference measurements and the raw measurement data (task 308). In this regard, the computing device 104 determines a formula or function for converting raw measurement data obtained by the metrology tool 102 to a corresponding measurement value for a dimension or characteristic of the feature of interest based on the relationship (or correlation) between the reference measurements for the feature of interest obtained from each respective DoE wafer and the corresponding raw measurement data obtained from each respective DoE wafer. Additionally, in some embodiments, the initial measurement model may account for one or more design parameters used to process the DoE wafers. In other words, the initial measurement model is a formula for converting raw measurement data from a subsequently processed wafer and values for one or more design parameters for that subsequently processed wafer to a corresponding measurement value for the feature of interest fabricated on that wafer, wherein the formula is determined based on the relationship (or correlation) between the raw measurement data obtained from the DoE wafers, the reference measurements of the feature of interest on the DoE wafers, and the stored values for one or more design parameters of the DoE wafers. In this regard, the initial measurement model formula estimates the correlation between the stored raw measurement data and stored design parameter values of a respective DoE wafer to the reference measurement of the feature of interest on that respective DoE wafer.

In exemplary embodiments, to generate the initial measurement model the computing device 104 determines constants (e.g., multipliers or divisors) by which the raw measurement data and design parameter values should be modified by along with the manner in which the raw measurement data and design parameter values should be combined to maximize the correlation (or minimize the aggregate differences) between the calculated (or converted) measurement values that would be obtained using the stored raw measurement data and stored design parameter values for the DoE wafers in the measurement model formula and their corresponding reference measurements. The design parameters included in the initial measurement model may be chosen as the design parameters (or combination thereof) that are most strongly correlated to the reference measurements. For example, the computing device 104 may receive an indication or identification of which design parameters are most likely to be correlated with the reference measurements from a process engineer based on his or her knowledge, experience, and technical expertise. After the computing device 104 determines the formula corresponding to the initial measurement model, the computing device 104 updates or otherwise configures the metrology tool 102 to utilize the initial measurement model formula as its measurement model 112 for converting subsequently obtained raw measurement data to measurement values for the feature of interest. It should be noted that although the adaptive modeling method 300 is described herein in the context of using an initial set of wafers to generate the initial measurement model, there are numerous different techniques that may be utilized to generate an initial measurement model, and the subject matter described herein does not require and is not intended to be limited to using an initial set of wafers to generate the initial measurement model. For example, the initial measurement model for feature being fabricated in a technology node (e.g., 28 nm) may be generated by scaling a measurement model that has been previously established or validated for that feature when fabricated using another technology node (e.g., 32 nm).

Once an initial measurement model for the feature of interest is determined, the adaptive modeling method 300 continues by fabricating the feature of interest on an additional wafer, obtaining raw measurement data from that wafer using the metrology tool being modeled, and obtaining a measurement value for the feature of interest using the measurement model (tasks 310, 312, 314). In this regard, an additional wafer 110 is provided to the processing tool(s) 108 that precede the metrology tool 102 for processing in accordance with a certain design parameter values, wherein the processing tool(s) 108 process the wafer 110 in accordance with those design parameter values to fabricate the feature of interest on the wafer 110. In accordance with one or more embodiments, the adaptive modeling method 300 is performed concurrently to the development of the fabrication process for a semiconductor device structure including the feature of interest, such that the design parameter values may vary (e.g. relative to the DoE wafers and/or other preceding wafers) as the fabrication process is developed. As described above, the computing device 104 obtains the design parameters values and stores or otherwise maintains those values for the design parameters in association with a unique identifier for the wafer 110 in the data storage element 114.

After processing by the processing tool(s) 108, the wafer 110 is provided to the metrology tool 102, which directs a reference signal towards the wafer 110 and receives a response signal embodying the raw measurement data for the wafer 110, as described above in the context of FIG. 2. In exemplary embodiments, the metrology tool 102 utilizes its measurement model 112 to convert the raw measurement data to a measurement value for the feature of interest as a function of the raw measurement data and one or more of the design parameter values for the wafer 110. As described above, the computing device 104 obtains, from the metrology tool 102, the raw measurement data for the wafer 110 along with the corresponding measurement value for the feature of interest that was calculated by the metrology tool 102.

In exemplary embodiments, the adaptive modeling method 300 continues by generating or otherwise determining an adjusted measurement model for the feature of interest by modifying the measurement model based at least in part on the raw measurement data for the most recently measured wafer in a manner that results in an improvement to one or more quality metrics of the measurement model (task 318). In this regard, as described in greater detail below in the context of FIG. 4, the computing device 104 may perform a feature model optimization method 400 to determine an adjusted measurement model as a function of raw measurement data that includes or otherwise incorporates additional and/or fewer design parameters than the previous measurement model or accommodates a different range of values for a respective design parameter of the previous measurement model. For example, when the computing device 104 determines that a quality metric for the measurement model 112 currently being utilized by the metrology tool 102 falls below a threshold value when the raw measurement data and design parameter values for the most recently measured wafer 110 are included, the computing device 104 utilizes the raw measurement data and one or more design parameter values for the most recently measured wafer 110 in along with one or more instances of stored raw measurement data and associated stored design parameter values. In this regard, the computing device 104 may obtain, from the data storage element 114, stored raw measurement data and stored design parameter values for a subset of the DoE wafers that have a value for a particular design parameter that is within a particular range of the value for that design parameter of the most recently measured wafer 110. For example, if the design parameter of the most recently measured wafer 110 is a deposition temperature, the computing device 104 may obtain stored raw measurement data and stored design parameter values for a subset of the DoE wafers that had a deposition temperature within plus or minus ten percent of the deposition temperature associated with the processing of the most recently measured wafer 110. Using the obtained subset of stored raw measurement data and design parameters along with the raw measurement data and design parameters for the most recently measured wafer 110, the computing device 104 determines a new measurement model formula for the feature of interest having an improved value for a particular quality metric as a function of the raw measurement data and one or more design parameters. As described above, to generate the adjusted measurement model, the computing device 104 may modify the constants (e.g., multipliers or divisors) by which the deposition temperature is modified and/or the manner in which the deposition temperature is combined with the raw measurement data and/or other design parameter values to maximize the correlation (or minimize the aggregate differences) between the calculated (or converted) measurement values that would be obtained using the stored raw measurement data and stored design parameter values for the DoE wafers having deposition temperatures within the identified range of deposition temperatures and their corresponding reference measurements. Thereafter, the computing device 104 updates or otherwise configures the metrology tool 102 to utilize the new measurement model formula as its measurement model 112 for converting subsequently obtained raw measurement data to measurement values for the feature of interest.

Still referring to FIG. 3, in exemplary embodiments, the adaptive modeling method 300 determines whether the model development cycle is complete (task 320). In some embodiments, the computing device 104 may determine the model development cycle is complete when the value(s) for one or more quality metrics associated with the adjusted measurement model exceeds threshold value(s) for those quality metric(s). In an alternative embodiment, the computing device 104 may determine the model development cycle is complete when the process development cycle for the processing being performed by the processing tool(s) 108 to fabricate the feature of interest is complete or has otherwise stabilized (e.g., when one or more design parameter values remain substantially constant for successive wafers 110). In another alternative embodiment, the computing device 104 may determine the model development cycle is complete when the difference between a value for a quality metric associated with the adjusted measurement model and a value for that quality metric associated with the previous measurement model is less than a threshold value indicating that subsequent iterations are unlikely to further improve the measurement model by more than a substantially negligible amount.

When the measurement model development cycle is not complete, the adaptive modeling method 300 repeats the loop defined by tasks 310, 312, 314, 316, 318 and 320 to dynamically and/or iteratively adjust the feature measurement model until the model development cycle is complete and/or a desired level of accuracy and/or reliability is achieved for measuring the feature of interest with the particular metrology tool being modeled. In this regard, once the metrology tool 102 is updated to implement the adjusted measurement model 112, the adaptive modeling method 300 repeats fabricating the feature of interest on an additional wafer 110 by preceding processing tool(s) 108, obtaining raw measurement data from that wafer 110 using the metrology tool 102, obtaining a measurement value for the feature of interest using the adjusted measurement model 112, and modifying the adjusted measurement model 112 (e.g., by modifying the constants in the formula, adding/removing design parameters from the formula, changing the manner in which design parameters and raw measurement data are combined, and the like) based at least in part on the raw measurement data for the most recently measured wafer 110 in a manner that results in further improvement to one or more quality metrics of the measurement model (task 318). In this regard, the new adjusted measurement model may be determined based on the raw measurement data and design parameter values for the current (or most recently measured) instance of wafer 110 and the stored raw measurement data and design parameter values for the preceding (or previously measured) instance(s) of wafer 110, which may also include the stored raw measurement data and associated stored design parameter values for one or more of the DoE wafers. In this regard, particular combination of raw measurement data and design parameter values used by the computing device 104 to generate the measurement model may vary dynamically to achieve an improvement in one or more quality metrics. Additionally, the raw measurement values and design parameter values for a particular wafer may be weighted differently than the raw measurement values and design parameter values for another wafer when determining the adjusted measurement model. For example, the raw measurement values and design parameter values for the current (or most recently measured) wafer 110 may be given the greatest weight or influence and the stored raw measurement values and design parameter values for the DoE wafers given the least weight or influence, with previously measured wafers 110 weighted between the current (or most recently measured) wafer 110 and the DoE wafers. In some embodiments, the weighting applied to wafers that are known to be outliers or otherwise exhibit unlikely process excursions, such as the DoE wafers, may be reduced relative to the weightings applied to the other wafers (e.g., by reducing the weighting applied to the outlier wafers by at least a factor of 10) to minimize the influence of those wafers on the adjusted measurement model.

After determining or otherwise identifying that the model development is complete, the adaptive modeling method 300 continues by providing the final adjusted measurement model for the feature of interest to a design library for use in obtaining measurements of that feature of interest using the type of metrology tool being modeled (task 320). For example, when the metrology tool 102 is a scatterometry tool, the computing device 104 may store, upload, transmit, or otherwise communicate the final adjusted measurement model to the design library 116 for use by other scatterometry tools when measuring that feature of interest fabricated in accordance with the design parameter values that fall within the range of design parameter values accommodated by the final adjusted measurement model.

Figure 4:
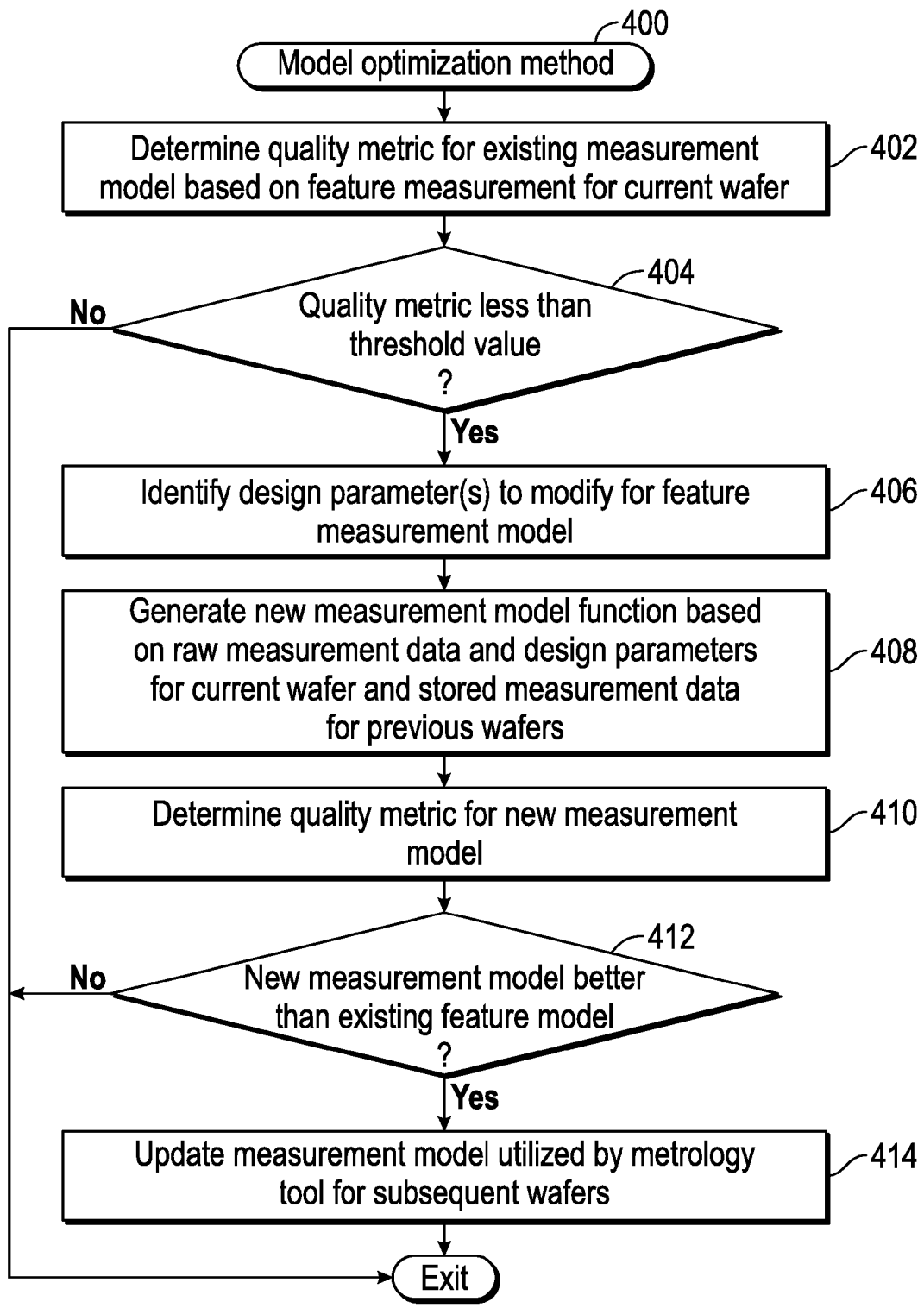
FIG. 4 is a flow diagram of an exemplary feature model optimization method suitable for use in the measurement system of FIG. 1 in connection with the adaptive modeling method of FIG. 3 in accordance with one or more embodiments.

FIG. 4 depicts an exemplary feature model optimization method 400 suitable for use in dynamically adjusting a measurement model for a particular physical feature or attribute of a semiconductor device structure. The various tasks performed in connection with the feature model optimization method 400 may be performed by software, hardware, firmware, or any combination thereof. For illustrative purposes, the following description refers to elements mentioned above in connection with FIGS. 1-2. In practice, portions of the feature model optimization method 400 may be performed by different elements of the measurement system 100, such as, for example, the computing device 104, the data storage element 114 and/or the processing module 126. It should be appreciated that the feature model optimization method 400 may include any number of additional or alternative tasks, the tasks need not be performed in the illustrated order and/or the tasks may be performed concurrently, and/or the feature model optimization method 400 may be incorporated into a more comprehensive procedure or process having additional functionality not described in detail herein. Moreover, one or more of the tasks shown and described in the context of FIG. 4 could be omitted from a practical embodiment of the feature model optimization method 400 as long as the intended overall functionality remains intact.

In exemplary embodiments, the feature model optimization method 400 begins by calculating or otherwise determining a value for a quality metric associated with the existing measurement model for the feature of interest based at least in part on the raw measurement data and/or design parameters for the most recently measured wafer and determining whether the quality metric is less than a threshold value (task 402, 404). In this regard, the computing device 104 may calculate or otherwise determine a value for a quality metric indicating the goodness of fit for the existing measurement model, such as the result of a chi-squared test, using the calculated measurement value for the feature of interest on the wafer 110 that was determined based on the raw measurement data and design parameter values for the wafer 110 and additional measurement values for the feature of interest from one or more previous wafers. For example, the additional measurement values for the feature of interest may be stored in the data storage element 114 in association with their corresponding wafer or the measurement values may be calculated using the stored raw measurement data and design parameters in the data storage element 114 for a respective wafer. The threshold value may be chosen to represent a desired level of accuracy and/or reliability for the measurement model, such that when the calculated value for the quality metric exceeds the threshold value, the feature model optimization method 400 may exit without adjusting or otherwise modifying the measurement model. In accordance with one or more embodiments, the threshold value may be chosen to be equal to the calculated value for the quality metric from a preceding iteration of the feature model optimization method 400, such that the measurement model is adjusted or otherwise modified whenever the quality metric decreases as new data points are added.

When the quality metric for the existing measurement model is less than the threshold value, the illustrated feature model optimization method 400 continues by identifying at least one design parameter for the measurement model to be modified (task 406). In this regard, the computing device 104 may identify or otherwise determine a design parameter to add to or remove from the measurement model as a variable in the measurement model formula, or identify or otherwise determine a different range of allowable values for a particular design parameter in the measurement model function. The computing device 104 may analyze the design parameter values for the current (or most recently measured) wafer 110 to identify a design parameter that deviates from values of the preceding wafers by a particular amount that indicates that design parameter is likely influencing the quality metric associated with the measurement model. For example, if the measured amount of top rounding of a feature on the current wafer 110 is more than twenty percent greater than the average amount of top rounding for the preceding and/or DoE wafers, the computing device 104 may identify that the top rounding measurement should be added to the measurement model function for determining the width of the feature.

After identifying a design parameter to be modified in the measurement model function, the feature model optimization method 400 continues by generating or otherwise determining a new measurement model based on the raw measurement data obtained from the current wafer and stored raw measurement data associated with wafers having a value for that design parameter within the range of allowed values for that design parameter (task 408). For example, if the computing device 104 determines that the top rounding measurement should be included in the measurement model function, the computing device 104 may obtain, from the data storage element 114, the stored raw measurement data obtained from each wafer having a stored value for the top rounding measurement. Thereafter, based at least in part on the raw measurement data for the current wafer 110 and the stored raw measurement data for previous wafers having stored top rounding measurements, the computing device 104 determines a new measurement model formula for the width of the feature that accounts for the top rounding in a similar manner as described above (e.g., by determining a new/different function (or combination) of raw measurement data and design parameter values with different constants or multipliers that maximizes the correlation between reference measurements and calculated measurements). As described above in the context of FIG. 3, in some embodiments, the most recently obtained raw measurement data and/or the design parameter values for the current wafer 110 may be weighted more heavily than the stored raw measurement data and/or stored design parameter values, or vice versa.

In exemplary embodiments, the feature model optimization method 400 continues by calculating or otherwise determining a value for a quality metric associated with the new feature measurement model, determining whether the new feature measurement model is better than the pre-existing feature measurement model based on the quality metric, and updating the feature measurement model utilized by the metrology tool being modeled (tasks 410, 412, 414). To determine the value for the quality metric for the new feature measurement model, the computing device 104 may calculate measurement values for one or more previous wafers that have both design parameter values within the range associated with the new feature measurement model and known reference feature measurements associated therewith. Thereafter, the computing device 104 may determine the quality metric based on the differences between the calculated measurement values for the feature and the corresponding stored reference measurements for the feature. If the quality metric determined for the new feature measurement model does not indicate the new feature measurement model is better than the previous feature measurement model, the feature model optimization method 400 may exit or otherwise terminate without modifying the measurement model 112 of the metrology tool 102. Conversely, when the quality metric determined for the new feature measurement model indicates the new feature measurement model is better than the previous feature measurement model, the computing device 104 updates or otherwise configures the measurement model 112 of the metrology tool 102 to utilize the newly determined measurement model function for calculating feature measurements for subsequent wafers.

As described above in the context of FIG. 3, the feature model optimization method 400 may be performed during each iteration of the adaptive modeling method 300 to dynamically adjust the measurement model 112 utilized by the metrology tool 102 based at least in part on the raw measurement data and the design parameter values for the wafer 110 most recently measured by the metrology tool 102 to achieve a desired level of accuracy and/or reliability for the feature measurements calculated by using the feature measurement model. Accordingly, the measurement model for a particular feature of interest may be determined concurrently to the development of the fabrication process for that feature of interest by dynamically adjusting the measurement model to reflect changes in the design parameters of the fabrication process. As a result, the overall time-to-solution may be reduced.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A method of fabricating a semiconductor device structure, the method comprising:
  obtaining raw measurement data for a wafer of semiconductor material from a metrology tool, the wafer having a first value for a design parameter and an attribute of the semiconductor device structure fabricated thereon, the metrology tool utilizing a measurement model to convert the raw measurement data to a measurement value for the attribute; and
  adjusting the measurement model based at least in part on the raw measurement data and the first value for the design parameter, wherein the method further comprises determining a second value for a quality metric associated with the measurement model based at least in part on the measurement value, and wherein adjusting the measurement model comprises adjusting the measurement model in response to determining the second value for the quality metric is less than a threshold value.

2. The method of claim 1, wherein adjusting the measurement model comprises configuring the metrology tool to utilize the adjusted measurement model determined based at least in part on the raw measurement data and the first value for the design parameter.

3. The method of claim 1, further comprising obtaining stored raw measurement data for a plurality of wafers of semiconductor material, each wafer of the plurality having a respective stored value for the design parameter and the attribute of the semiconductor device structure fabricated thereon, wherein adjusting the measurement model comprises adjusting the measurement model based at least in part on the raw measurement data, the first value for the design parameter, the stored raw measurement data, and the respective stored values for the design parameter.

4. The method of claim 3, further comprising determining the measurement model based on relationships between the stored raw measurement data for a respective wafer of the plurality of wafers and the respective stored value for the design parameter associated with the respective wafer, wherein adjusting the measurement model comprises determining a new measurement model based at least in part on a relationship between the raw measurement data and the first value for the design parameter associated with wafer.

5. The method of claim 1, the measurement model comprising a formula for determining a respective measurement value for the attribute as a function of raw measurement data obtained from the metrology tool for a respective wafer and the design parameter for the respective wafer, wherein adjusting the measurement model comprises adjusting a range for the design parameter in the formula to include the first value.

6. The method of claim 5, wherein adjusting the range for the design parameter in the formula further comprises:
  obtaining stored raw measurement data for a plurality of wafers of semiconductor material, each wafer of the plurality having a respective stored value for the design parameter within the range and the attribute of the semiconductor device structure fabricated thereon;
  determining a new formula for determining the respective measurement value for the attribute as a function of raw measurement data obtained from the metrology tool and the design parameter based at least in part on the stored raw measurement data and the stored values for the design parameter.

7. The method of claim 1, the measurement model comprising a formula for determining a respective measurement value for the attribute as a function of raw measurement data obtained from the metrology tool for a respective wafer, wherein adjusting the measurement model comprises determining a new formula for determining the respective measurement value for the attribute as a function of raw measurement data obtained from the metrology tool and the design parameter.

8. The method of claim 7, further comprising obtaining stored raw measurement data for a plurality of wafers of semiconductor material, each wafer of the plurality having a respective stored value for the design parameter and the attribute of the semiconductor device structure fabricated thereon, wherein determining the new formula comprises determining the new formula based at least in part on the raw measurement data for the wafer, the first value for the design parameter, the stored raw measurement data for the plurality of wafers, and the stored values for the design parameter.

9. A method of fabricating a semiconductor device structure, the method comprising:
  fabricating a feature of the semiconductor device structure on a first wafer of semiconductor material having a first value for a design parameter;
  obtaining first raw measurement data for the first wafer from a metrology tool, the metrology tool utilizing an existing measurement model;
  determining an adjusted measurement model based at least in part on the first raw measurement data, the first value, second raw measurement data obtained from the metrology tool for a second wafer, and a second value, the second wafer having the second value for the design parameter;
  configuring the metrology tool to utilize the adjusted measurement model when a quality metric indicates the adjusted measurement model is better than the existing measurement model.

10. The method of claim 9, further comprising:
  determining a third value for the quality metric for the existing measurement model based at least in part on the first raw measurement data and the first value; and
  determining a fourth value for the quality metric for the adjusted measurement model, wherein the configuring comprises configuring the metrology tool to utilize the adjusted measurement model when the fourth value is greater than the third value.

11. The method of claim 9, further comprising:
storing the second raw measurement data and the second value for the design parameter in association with the second wafer in a data storage element; and
obtaining the second raw measurement data and the second value from the data storage element prior to determining the adjusted measurement model.

12. The method of claim 9, wherein determining the adjusted measurement model comprises weighting the first raw measurement data and the first value relative to the second raw measurement data and the second value.

13. The method of claim 9, the existing measurement model including a formula having a plurality of constants for modifying measurement data from the metrology tool or the design parameter, wherein determining the adjusted measurement model comprises modifying one or more constants of the plurality.

14. A computer-readable medium having computer-executable instructions stored thereon executable by a computing device to:
obtain raw measurement data for a wafer of semiconductor material from a metrology tool, the wafer having a first value for a design parameter and an attribute of a semiconductor device structure fabricated thereon, the metrology tool utilizing a measurement model to convert the raw measurement data to a measurement value for the attribute; and
adjust the measurement model based at least in part on the raw measurement data and the first value for the design parameter, wherein the computer-executable instructions stored thereon are executable by the computing device to determine a second value for a quality metric associated with the measurement model based at least in part on the measurement value, wherein the measurement model is adjusted in response to determining the second value for the quality metric is less than a threshold value.

15. The computer-readable medium of claim 14, wherein the computer-executable instructions stored thereon are executable by the computing device to configure the metrology tool to utilize the adjusted measurement model determined based at least in part on the raw measurement data and the first value for the design parameter.

16. The computer-readable medium of claim 14, wherein the computer-executable instructions stored thereon are executable by the computing device to obtain stored raw measurement data for a plurality of wafers of semiconductor material from a data storage element coupled to the computing device, each wafer of the plurality having a respective stored value for the design parameter and the attribute of the semiconductor device structure fabricated thereon, wherein the measurement model is adjusted based at least in part on the raw measurement data, the first value for the design parameter, the stored raw measurement data, and the respective stored values for the design parameter.

17. The computer-readable medium of claim 14, wherein:
the measurement model comprises a formula for determining a respective measurement value for the attribute as a function of raw measurement data obtained from the metrology tool for a respective wafer and the design parameter for the respective wafer; and
the computer-executable instructions stored thereon are executable by the computing device to adjust the measurement model by adjusting a range for the design parameter in the formula to include the first value.

18. The computer-readable medium of claim 14, wherein:
the measurement model comprises a formula for determining a respective measurement value for the attribute as a function of raw measurement data obtained from the metrology tool for a respective wafer; and
the computer-executable instructions stored thereon are executable by the computing device to adjust the measurement model by determining a new formula for determining the respective measurement value for the attribute as a function of raw measurement data obtained from the metrology tool and the design parameter.

\* \* \* \* \*